United States Patent
Ghyselen et al.

(10) Patent No.: US 12,482,701 B2
(45) Date of Patent: Nov. 25, 2025

(54) METHOD FOR PRODUCING A STACKED STRUCTURE

(71) Applicant: Soitec, Bernin (FR)

(72) Inventors: Bruno Ghyselen, Seyssinet (FR); François-Xavier Darras, Apprieu (FR)

(73) Assignee: Soitec, Bernin (FR)

( * ) Notice: Subject to any disclaimer, the term of this patent is extended or adjusted under 35 U.S.C. 154(b) by 573 days.

(21) Appl. No.: 17/907,043

(22) PCT Filed: Mar. 16, 2021

(86) PCT No.: PCT/FR2021/050434
§ 371 (c)(1),
(2) Date: Sep. 22, 2022

(87) PCT Pub. No.: WO2021/191527
PCT Pub. Date: Sep. 30, 2021

(65) Prior Publication Data
US 2023/0120346 A1    Apr. 20, 2023

(30) Foreign Application Priority Data
Mar. 23, 2020   (FR) ..................................... 2002813

(51) Int. Cl.
*H01L 21/762* (2006.01)
*H01L 21/02* (2006.01)
(Continued)

(52) U.S. Cl.
CPC .. *H01L 21/76254* (2013.01); *H01L 21/02592* (2013.01); *H01L 21/02595* (2013.01);
(Continued)

(58) Field of Classification Search
None
See application file for complete search history.

(56) References Cited

U.S. PATENT DOCUMENTS

| 11,600,766 B2 | 3/2023 | Ghyselen et al. |
| 2012/0013013 A1* | 1/2012 | Sadaka ................... H01L 24/92 257/773 |

FOREIGN PATENT DOCUMENTS

| EP | 2422365 | * | 4/2010 |
| EP | 2422365 B1 | | 8/2014 |

(Continued)

OTHER PUBLICATIONS

European Office Action for Application No. 21718933.1 dated Oct. 6, 2023, 12 pages.
(Continued)

*Primary Examiner* — Alexander G Ghyka
(74) *Attorney, Agent, or Firm* — TraskBritt

(57) ABSTRACT

A method for producing a stacked structure comprises: a) providing a carrier substrate and an initial substrate, each having a front face and a back face, b) forming a buried weakened plane in the carrier substrate or in the initial substrate, by implanting light ions through the front face of either of the substrates, c) joining the carrier substrate and the initial substrate via their respective front faces, d) thinning the initial substrate via its back face to form a donor substrate e) providing a receiver substrate having a front face and a back face, f) joining the donor substrate and the receiver substrate via their respective front faces, and g) separating along the buried weakened plane, so as to form the stacked structure comprising the receiver substrate and a surface film including all or part of a donor layer originating from the initial substrate.

9 Claims, 8 Drawing Sheets

(51) Int. Cl.
  *H01L 21/18*   (2006.01)
  *H10D 62/832*  (2025.01)
  *H10N 30/093*  (2023.01)

(52) U.S. Cl.
  CPC ...... *H01L 21/02598* (2013.01); *H01L 21/187* (2013.01); *H10D 62/8325* (2025.01); *H10N 30/093* (2023.02)

(56) References Cited

FOREIGN PATENT DOCUMENTS

| FR | 2748851 B1 | 11/1997 |
|----|------------|---------|
| FR | 2823596 A1 | 10/2002 |
| FR | 2823599 A1 | 10/2002 |
| FR | 2940852 A1 | 7/2010 |
| FR | 3045678 B1 | 12/2017 |
| JP | 07-130591 A2 | 5/1995 |
| JP | 08-153915 A | 6/1996 |
| JP | 11-097654 A2 | 4/1999 |
| JP | 2006-528592 A | 12/2006 |
| JP | 2013-526030 A | 6/2013 |
| JP | 2017-126749 A2 | 7/2017 |
| KR | 10-2011-0126532 A | 11/2011 |
| WO | 2019/110886 A1 | 6/2019 |

OTHER PUBLICATIONS

Singapore Office Action and Search Report for Application No. 1120225867U dated Jun. 26, 2025, 11 pages.
International Search Report for International Application No. PCT/FR2021/050434 dated Jun. 15, 2021, 2 pages.
International Written Opinion for International Application No. PCT/FR2021/050434 dated Jun. 15, 2021, 5 pages.
Korean Notice of Non-Final Rejection for Application No. 10-2018-7021277 dated Oct. 13, 2023, 6 pages.
Japanese Notice of Refusal for Application No. 2022-554322 dated Oct. 1, 2024, 20 pages with machine translation.
Taiwanese Office Action and Search Report for Application No. 110108281 dated Jun. 28, 2024, 8 pages with machine translation.
Korean Office Action for Application No. 10-2022-7033012 dated Sep. 17, 2025, 12 pages with machine translation.

* cited by examiner

METHOD FOR PRODUCING A STACKED STRUCTURE

CROSS-REFERENCE TO RELATED APPLICATIONS

This application is a national phase entry under 35 U.S.C. § 371 of International Patent Application PCT/FR2021/050434, filed Mar. 16, 2021, designating the United States of America and published as International Patent Publication WO 2021/191527 A1 on Sep. 30, 2021, which claims the benefit under Article 8 of the Patent Cooperation Treaty to French Patent Application Serial No. FR2002813, filed Mar. 23, 2020.

TECHNICAL FIELD

Potential applications of the present disclosure are in the fields of microelectronics, microsystems, optoelectronics, photonics and RF filters. It relates to a process for producing a stacked structure comprising a surface film arranged on a functionalized substrate.

BACKGROUND

In the field of microelectronics and, in particular, of MEMS (microelectromechanical systems), it is generally useful to transfer a thick membrane (for example, with a thickness of more than 5 microns) onto a substrate that has previously undergone structuring steps in order to integrate various functions. This functionalized substrate may, for example, be provided with cavities and/or nano- or microelectronic devices. The target thick membrane may, in particular, be made of semiconductor, insulating, or piezoelectric material or exhibit other physical properties depending on the target application.

To transfer the thick membrane, it is known practice to join a donor substrate, from which the membrane will be taken, to the functionalized substrate, and then to mechanically and/or chemically thin the donor substrate from its free back face. One drawback of this approach stems from the fact that the mechanical and chemical treatments are restrictive and liable to degrade the quality of the membrane during transfer, and/or of the functionalized substrate. In particular, when the functionalized substrate comprises cavities, the membrane may exhibit cracks or peeling regions facing the cavities, and non-uniformities of thickness; when the functionalized substrate comprises microelectronic components, the membrane sometimes exhibits non-uniformities of thickness related to the patterns and topologies of subjacent components, and/or the components may undergo degradation.

The SMARTCUT® process, well known per se, is particularly suitable for the transfer of membranes characterized as "thin," i.e., with a thickness that is typically less than 1.5 micron, onto receiver substrates, whether functionalized or otherwise. However, with conventional ion-implantation equipment, the transfer of thick membranes from several microns to several tens of microns is not directly achievable.

Other processes are based on detachment by applying a mechanical stress or a chemical treatment to a weakened interface present in the donor substrate. The donor substrate may then be characterized as a "detachable substrate" because it comprises, between the future membrane and the rest of the donor substrate, the weakened interface, which will be the site of the detachment, i.e., of the separation.

This is, in particular, the case of the processes described in the documents FR2748851, FR2823599, FR2823596 or WO2019110886. One limitation of these approaches may stem primarily from the fact that the detaching steps, carried out by inserting a blade between the attached initial and target substrates, by subjecting them to substantial tensile stresses and/or by immersing them for a long time in a chemical solution, are liable to negatively affect the quality of the membrane. Furthermore, detachment may sometimes occur at interfaces or layers other than the weakened one due to the difficulty in precisely localizing the mechanical stress and/or the chemical attack to the weakened interface.

Still other processes, based on separation at an interface by laser (laser lift-off), require the use of a transparent substrate for the functionalized substrate or for the donor substrate, which limits the field of applications.

The present disclosure relates to an alternative solution to those of the state of the art, and is targeted at completely or partly overcoming the abovementioned disadvantages. It relates to a process for producing a stacked structure comprising a surface film arranged on a functionalized substrate.

BRIEF SUMMARY

The present disclosure relates to a process for producing a stacked structure comprising a receiver substrate and a surface film. The process comprises the following steps:
a) providing a carrier substrate and an initial substrate, each having a front face and a back face,
b) forming a buried weakened plane in the carrier substrate or in the initial substrate, by implanting light ions through the front face of either of the substrates,
c) joining the carrier substrate and the initial substrate via their respective front faces,
d) mechanically and/or chemically thinning the initial substrate via its back face in order to form a donor substrate comprising a donor layer originating from the initial substrate and arranged on the carrier substrate, and the buried weakened plane present in the carrier substrate or in the donor layer, the donor substrate having a front face on the side of the donor layer and a back face on the side of the carrier substrate,
e) providing a receiver substrate having a front face and a back face,
f) joining the donor substrate and the receiver substrate via their respective front faces,
g) separating along the buried weakened plane, so as to form the stacked structure comprising the receiver substrate and the surface film including all or part of the donor layer.

According to other advantageous and non-limiting features of the present disclosure, taken alone or in any technically feasible combination:
the process comprises a step, prior to joining step f), of forming at least one functionalized layer on the front face of the donor substrate and/or on the front face of the receiver substrate, the stacked structure then comprising the receiver substrate, the surface film and the functionalized layer inserted between the receiver substrate and the surface film;
the functionalized layer comprises a plurality of micro- or nanostructured regions and/or a plurality of cavities and/or a plurality of micro- or nanoelectronic components;
the components are chosen from among transistors, MEMSs, sensors, resonators, imagers, actuators, radiofrequency filters, diodes and lasers;

the cavities have lateral dimensions of between 1 micron and a few hundreds of microns, and a depth on the order of 0.1 micron to a few tens of microns;

the buried weakened plane is formed in the carrier substrate;

the surface film transferred upon completion of step g) comprises a transferred thin layer originating from the carrier substrate;

the transferred thin layer is removed by chemical etching;

the buried weakened plane is formed in the initial substrate;

steps of chemical-mechanical polishing, of chemical etching and/or of cleaning are performed after separating step g) in order to at least partially restore the surface quality of the surface film;

the surface film is formed from at least one semiconductor material chosen from among silicon, germanium, silicon carbide, III-V compounds, and/or from at least one insulating material chosen from among sapphire, diamond, and/or from at least one piezoelectric material chosen from among lithium tantalate, lithium niobate;

the receiver substrate is formed from at least one semiconductor and/or insulating and/or metal, monocrystalline, polycrystalline or amorphous material;

the receiver substrate has a thickness of between a few tens of microns and 1000 microns.

BRIEF DESCRIPTION OF THE DRAWINGS

Other features and advantages of the present disclosure will become apparent from the following detailed description of example embodiments of the present disclosure, which is given with reference to the accompanying figures, in which.

DETAILED DESCRIPTION

Figure 1A:
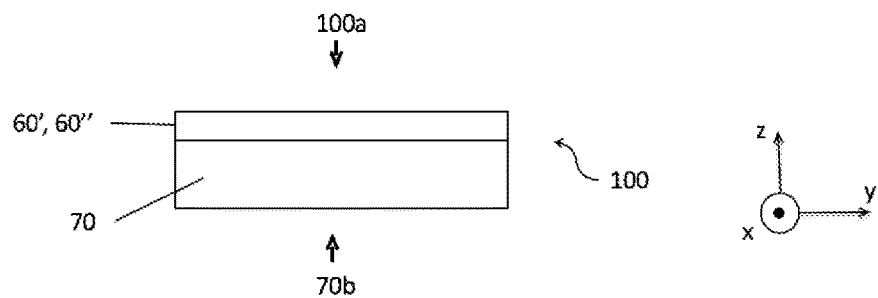
FIGS. 1A, 1B and 1C show examples of stacked structures obtained using a production process according to the present disclosure.

In the description, the same reference numerals in the figures may be used for elements of the same type. The figures are diagrammatic representations, which, for the sake of readability, are not to scale. In particular, the thicknesses of the layers along the z-axis are not to scale with respect to the lateral dimensions along the x- and y-axes; and the relative thicknesses of the layers with respect to one another are not respected in the figures.

Figure 1B:
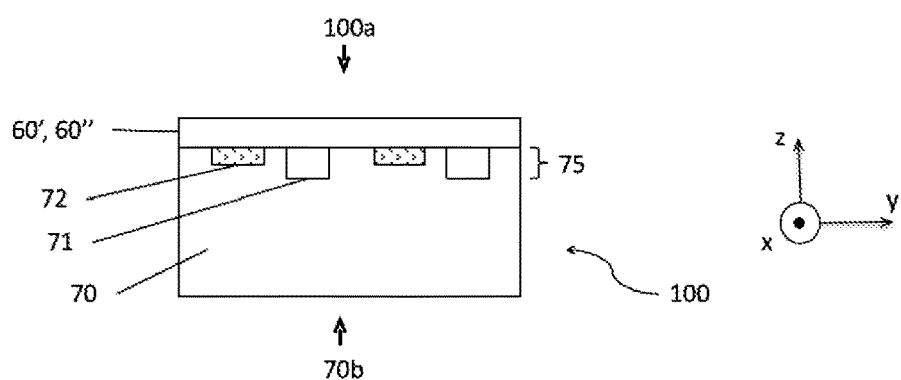
Figure 1C:
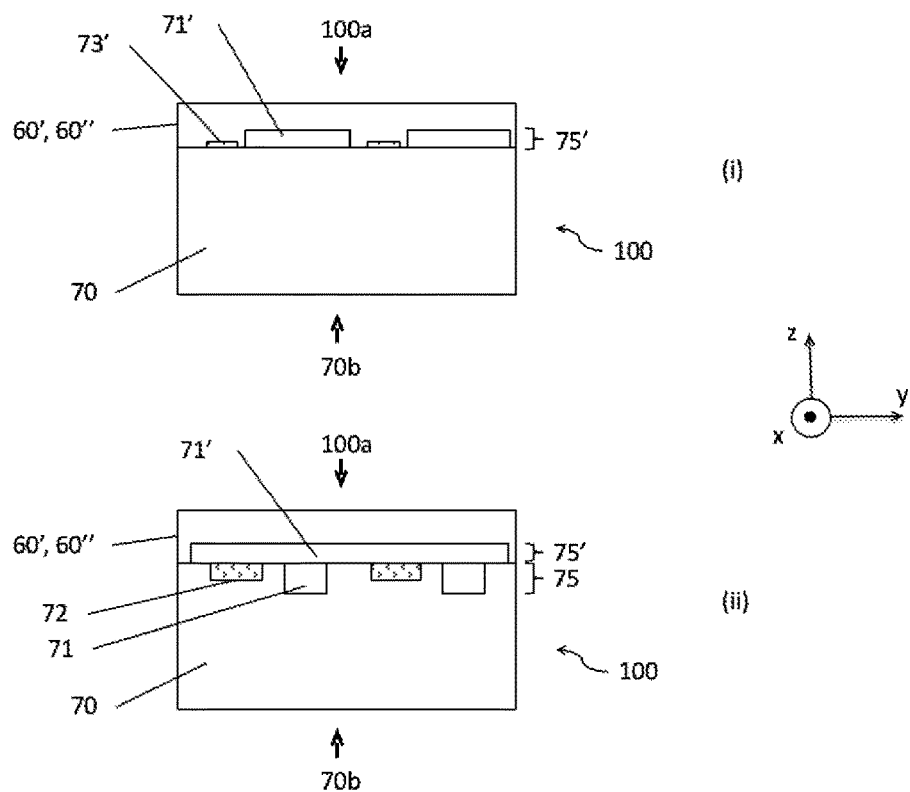

The stacked structure 100 resulting from the production process according to the present disclosure comprises a receiver substrate 70 and a surface film 60', 60", as illustrated in FIGS. 1A to 1C.

The receiver substrate 70 has a front face 70a and a back face 70b (FIGS. 2E and 3E) and is advantageously in the form of a wafer, with a diameter greater than 100 mm, for example, 150 mm, 200 mm, 300 mm, or even 450 mm. Its thickness is typically between a few tens of microns and 1000 microns, for example, between 100 microns and 800 microns. It may be formed from any semiconductor, insulating or conductive material, of monocrystalline, polycrystalline or amorphous quality, depending on the target application.

According to a first aspect of the present disclosure illustrated in FIG. 1A, the receiver substrate 70 is not very compatible with mechanical thinning techniques or the application of mechanical stresses, either due to the nature of the one or more materials of which it is formed (for example, a fragile material such as some glasses), or due to its low thickness (for example, a thickness of less than 400 microns, than 250 microns, or even less than 150 microns).

According to a second aspect of the present disclosure, which may be combined with the first aspect or otherwise, the receiver substrate 70 comprises a functionalized layer 75 (FIGS. 1B, 1C). What is meant by functionalized is that the functionalized layer 75 comprises micro- or nanostructured regions, and/or cavities 71 filled with or devoid of solid material, and/or a plurality of partially or completely formed micro- or nanoelectronic components 72. The functionalized layer 75 may be formed in or on the receiver substrate 70, at the level of its front face 70a. In general, the functionalized layer 75 may therefore form all types of regularly or locally distributed topologies and include additional materials with respect to that (or those) forming the receiver substrate 70. By way of example, the additional materials could be oxides, nitrides or metals.

The stacked structure 100 also comprises a surface film 60', 60" arranged on the receiver substrate 70. When present, the functional layer 75 is inserted between the surface film 60', 60" and the receiver substrate 70.

The surface film 60', 60" may be of various natures and exhibit various properties, depending on the target application for the stacked structure 100.

It may advantageously comprise a monocrystalline material guaranteeing the stability and the reproducibility of its properties, in contrast, for example, to the case of a polycrystalline material for which the mechanical properties are heavily dependent on the conditions of deposition (size and shape of the grains, nature of the grain boundaries, stresses, etc.). A monocrystalline material may also allow the formation of micro- or nanoelectronic components on or in the surface film 60', 60" of the stacked structure 100. The components could be connected to the functionalized layer 75 of the receiver substrate 70 (when present).

Preferably, but without limitation, the surface film 60', 60" may be formed from at least one semiconductor material chosen from among silicon, germanium, silicon carbide, III-V compounds, and/or from at least one insulating material such as from among sapphire, diamond, and/or from at least one piezoelectric material such as from among lithium tantalate and lithium niobate. It may have a thickness of between 2 microns and 300 microns, advantageously between 5 microns and 80 microns.

Generally, the surface film 60', 60" may be formed by one or more, continuous or discontinuous, layers of various materials.

According to a first option, the surface film 60', 60" of the stacked structure 100 is virgin or continuous, i.e., without particular structuring (FIGS. 1A, 1B). As mentioned above, deposition, structuring or other device formation steps could be carried out on the free face, front face 100a, upon completion of the production of the stacked structure 100.

According to a second option, the surface film 60', 60" comprises a second functionalized layer 75', comprising for example, micro- or nanostructured regions 73' and/or one or more cavities 71' facing the front face of the receiver substrate 70 (FIG. 1C). The surface film 60', 60" may, for example, form a movable membrane above the cavity 71', with predefined metal contacts 73', with a view to producing a MEMS device later on (FIG. 1C (i)). According to another example, the surface film 60', 60" may, for example, provide an encapsulation cover for the components 72 of the functionalized layer 75 of the receiver substrate 70, by virtue of the presence of the cavity 71' made in the surface film 60', 60", even if the components 72 form a substantial topology on the front face 70a of the receiver substrate 70 (FIG. 1C (ii)).

Hereinafter, first functionalized layer 75 and second functionalized layer 75' will refer to the functionalized layers formed, respectively, on the receiver substrate 70 and on a donor substrate 60 from which the surface film 60', 60" is taken. It is recalled that any combination of the first aspect of the present disclosure, of the second aspect of the present disclosure, of the first option and of the second option that are mentioned above is conceivable, even though the set of combinations is not necessarily illustrated or specified in the description.

It should be noted that an intermediate layer could be introduced between the surface film and 60', 60" and the receiver substrate 70, whether it is arranged on the side of the surface film 60', 60" or on the side of the receiver substrate 70, in order to promote their joining or to provide a function of electrical or thermal conduction or insulation between the receiver substrate 70 and the surface film 60', 60".

The method for producing the stacked structure 100 mentioned above will now be described with reference to FIGS. 2A to 2G, 3A to 3G, 4A to 4B and 5A to 5B.

Figure 2A:
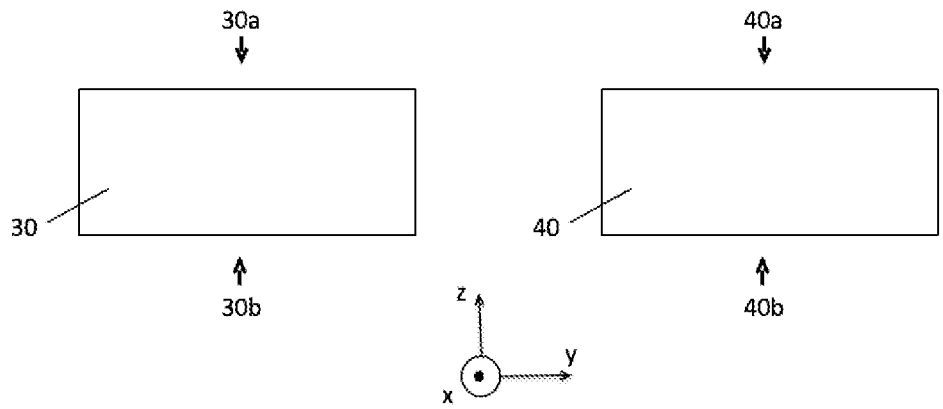
FIGS. 2A to 2G show steps of a process for producing the stacked structure according to a first embodiment of the present disclosure.
Figure 3A:
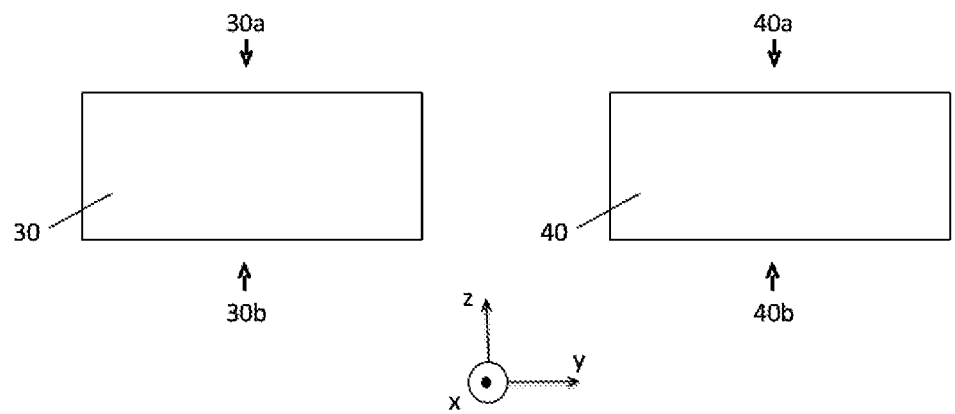
FIGS. 3A to 3G show steps of a process for producing the stacked structure according to a second embodiment of the present disclosure.

The production process first comprises a step a) of providing a carrier substrate 30 and an initial substrate 40, each having a front face 30a, 40a and a back face 30b, 40b (FIGS. 2A, 3A). These two substrates 30, 40 are advantageously in the form of a wafer, with a diameter greater than 100 mm, for example, 150 mm, 200 mm, 300 mm, or even 450 mm. Their thickness is typically between 200 and 900 microns.

As will be apparent hereinafter, the initial substrate 40 is that from which the surface film 60', 60" will mainly be taken. Thus, the materials mentioned above with reference to the surface film 60', 60" apply, without limitation of course. The nature and the properties of the initial substrate 40 will therefore be intimately associated with the target application for the stacked structure 100.

The carrier and initial substrates 30, 40 could be virgin or comprise one or more layers of potentially different nature than that of the substrates.

Figure 2B:
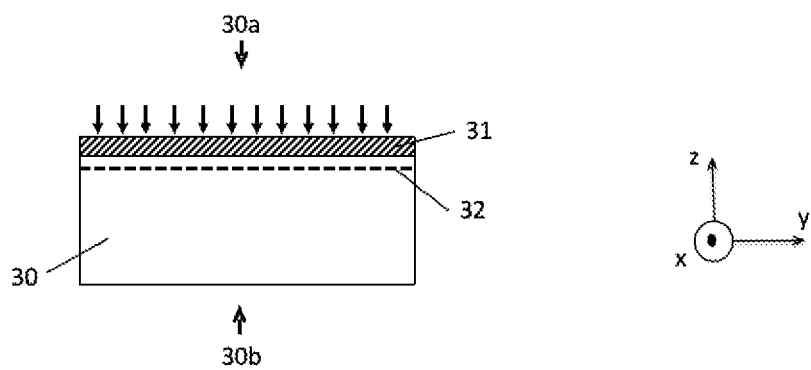
Figure 3B:
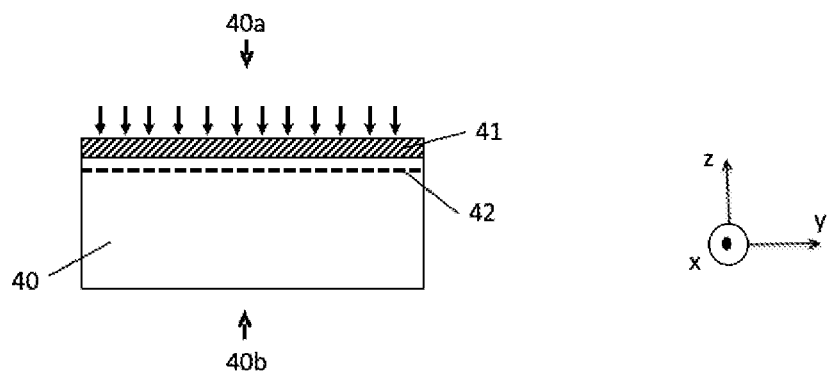

Step b) in the process according to the present disclosure comprises forming a buried weakened plane 32, 42 in the carrier substrate 30 or in the initial substrate 40, by implanting light ions through the front face of either of the substrates 30, 40 (FIGS. 2B, 3B).

As well known with reference to the SMARTCUT® process mentioned in the introduction, the light ions are advantageously chosen from among hydrogen, helium or a combination of these two species. The implantation energy and dose are defined so as to generate, in a later step g) of the process, spontaneous separation through the application of a heat treatment at a moderate temperature, typically lower than 700° C., preferably even lower than 600° C., than 500° C., than 350° C., or even than 300° C. It is known that it is effectively possible to act on the kinetics of coalescence of the microcracks present in the buried weakened plane 32, 42 according to the species implanted, the dose introduced, the material in which the weakened plane 32, 42 is formed, etc.

According to a first embodiment, illustrated in FIG. 2B onwards, the buried weakened plane 32 is formed in the carrier substrate 30. This substrate is preferably monocrystalline in nature in order to promote the formation of the buried weakened plane 32 through the implantation of the light species. A protective layer 31, for example, made of silicon oxide or of silicon nitride, may potentially be arranged on the front face 30a of the carrier substrate 30, in order to protect the substrate during implantation.

According to a second embodiment, illustrated in FIG. 3B onwards, the buried weakened plane 42 is formed in the initial substrate 40. This substrate is, preferably, monocrystalline in nature in order to promote the formation of the buried weakened plane 42 through the implantation of the light species. Optionally, a protective layer 41, for example, made of silicon oxide or of silicon nitride, may be arranged on the front face 40a of the initial substrate 40, in order to protect the substrate during implantation.

In general, for either of the embodiments, the carrier substrate 30 is advantageously chosen from among low-cost materials. Mention may be made, by way of example, of low- or medium-quality monocrystalline silicon or polycrystalline silicon, glass, etc. The initial substrate 40 is advantageously composed of one or more materials, the nature and the quality (defect density, crystallinity) of which are defined by the specifications that have to be met by the surface film 60', 60" of the target stacked structure 100. It could, in particular, comprise at least one semiconductor material and/or at least one insulating material and/or at least one conductive material and/or at least one piezoelectric material.

In both of the embodiments, the buried weakened plane 32, 42 is located less than 2 μm from the free surface of the front face 30a, 40a of the substrates 30, 40. Advantageously, it is even located at a depth of less than 1 micron, or even less than 0.5 micron.

Figure 2C:
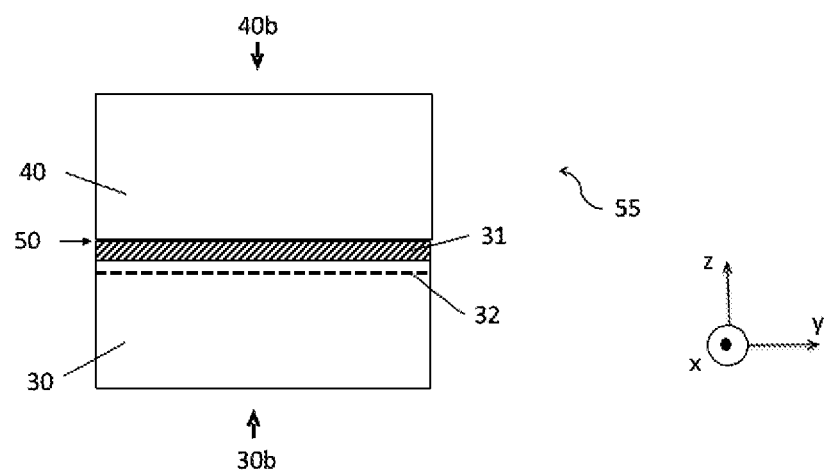
Figure 3C:
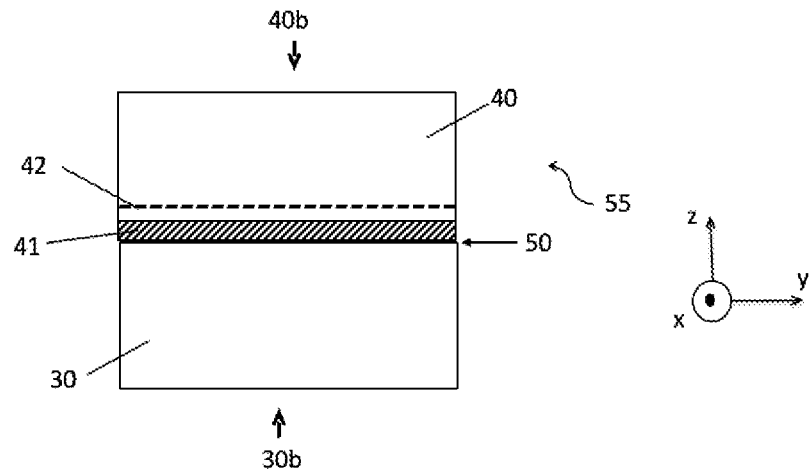

The production process according to the present disclosure next comprises a step c) of joining the carrier substrate 30 and the initial substrate 40 via their respective front faces 30a, 40a (FIGS. 2C, 3C).

Various types of joining are conceivable. It will be possible, in particular, to implement direct bonding at ambient temperature, by molecular adhesion, or thermocompression or eutectic bonding at low temperature (typically below 350° C.), with joining surfaces of insulating or metal nature. A joining interface 50 is thus defined between the two substrates 30, 40, which form, at this stage of the process, a first bonded structure 55.

The protective layer 31, 41 may be retained or removed prior to joining step c). When it is retained, it may be used as an intermediate layer with a view to improving the mechanical strength of the bonding interface 50. When it is removed, an electrically conductive or insulating intermediate layer may be deposited on either of the substrates 30, 40 to be joined, in order to promote the bonding quality (low defect density, high bonding energy). Alternatively, the initial substrate 40 may be joined directly to the carrier substrate 30.

Advantageously, sequences of cleaning and of plasma surface activation are applied to the substrates 30, 40 before their joining, still with a view to guaranteeing good bonding quality. Smoothing treatments, for example, chemical-mechanical polishing, may also be applied to them, so as to make their surfaces as planar as possible, and to decrease the surface roughness at high and low frequencies of their respective front faces 30a, 40a.

Optionally, a heat treatment for consolidating the interface 50 is carried out, by subjecting the first bonded structure 55 to a low temperature, typically lower than 300° C., or even lower than 250° C., for a duration on the order of a few hours. The thermal budget applied to the bonded structure 55 during this heat treatment must imperatively stay below the thermal budget allowing spontaneous separation at the level of the buried weakened plane 32, 42.

Figure 2D:
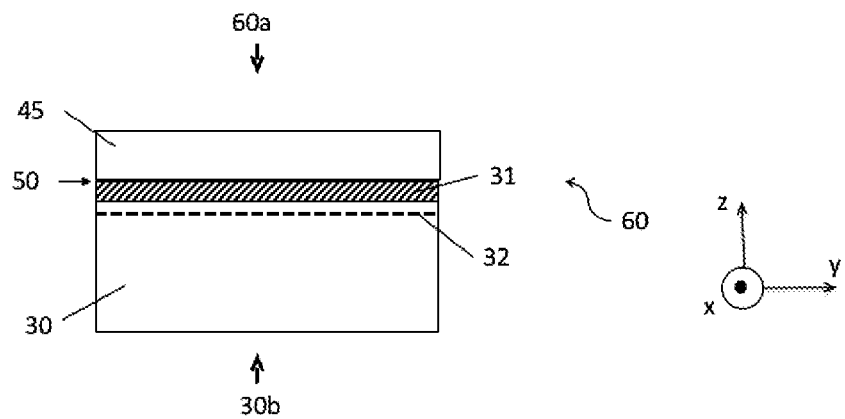
Figure 3D:
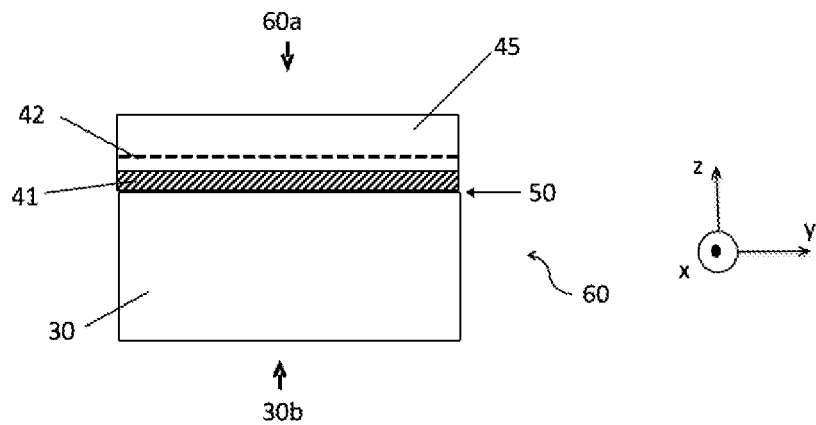

After joining, the production process comprises a step d) of mechanically and/or chemically thinning the initial substrate 40 via its back face 40b in order to form a donor substrate 60 (FIGS. 2D, 3D). Such thinning may be carried out using the known techniques of mechanical grinding, chemical-mechanical polishing and/or chemical etching. Since the initial and carrier substrates 40, 30 are virgin or provided with simple stacks of uniform and continuous layers, and the first bonded structure 55 comprises a bonding interface 50 that is homogeneous over its entire surface (typically without cavities or other structuring), the thinning steps may be controlled very well and result in the formation of a uniform and perfectly intact donor layer 45.

The donor substrate 60 comprises a donor layer 45 originating from the initial substrate 40 and arranged on the carrier substrate 30. The donor layer 45 could have a thickness of between a few microns and 300 microns, advantageously between 5 microns and 80 microns.

The donor substrate 60 has a front face 60a, on the side of the donor layer 45, and a back face 30b, on the side of the carrier substrate 30, also the back face of the carrier substrate 30.

In the first embodiment, the buried weakened plane 32 is present in the carrier substrate 30 (FIG. 2D), whereas in the second embodiment, the buried weakened plane 42 is in the donor layer 45 (FIG. 3D). In both cases, the buried weakened plane 32, 42 is located less than 1.5 microns from the bonding interface 50, or even less than 0.5 micron.

Figure 4A:
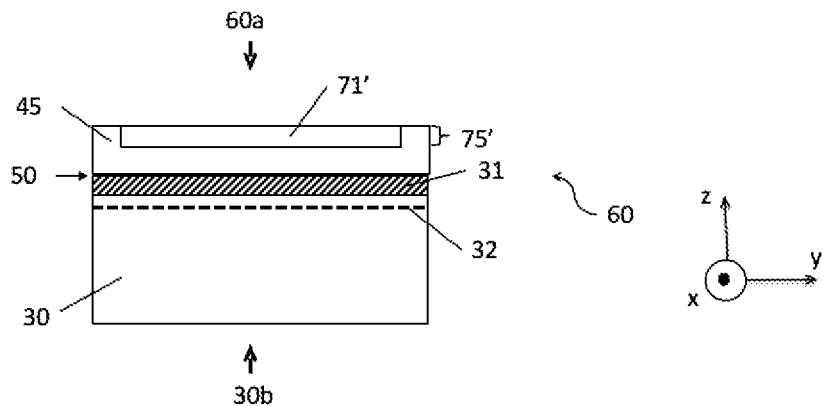
FIGS. 4A and 4B show one variant of the first embodiment according to the production process in accordance with the present disclosure.
Figure 4B:
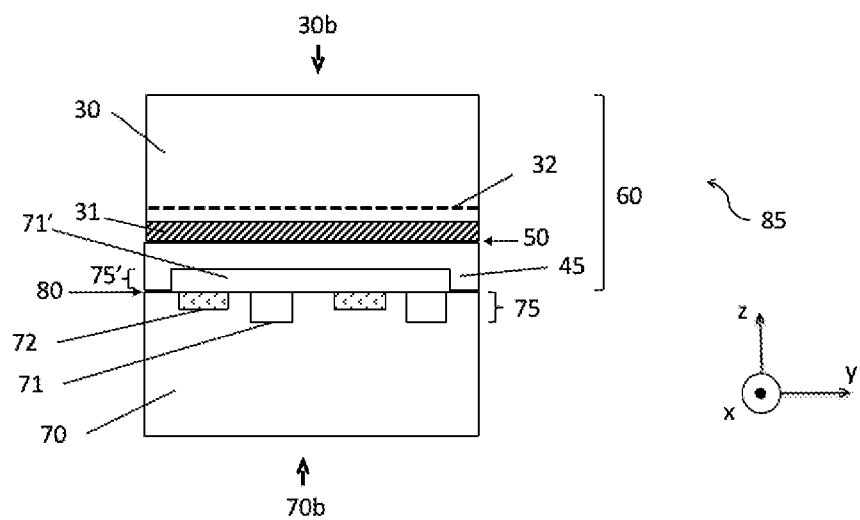
Figure 5A:
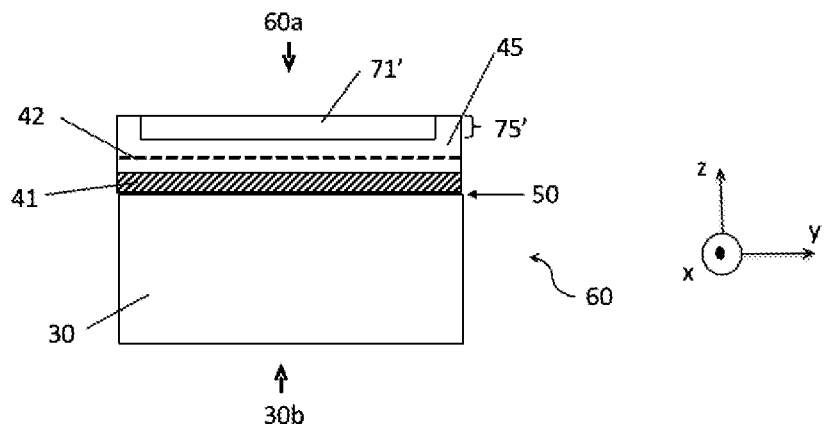
FIGS. 5A and 5B show one variant of the second embodiment according to the production process in accordance with the present disclosure.
Figure 5B:
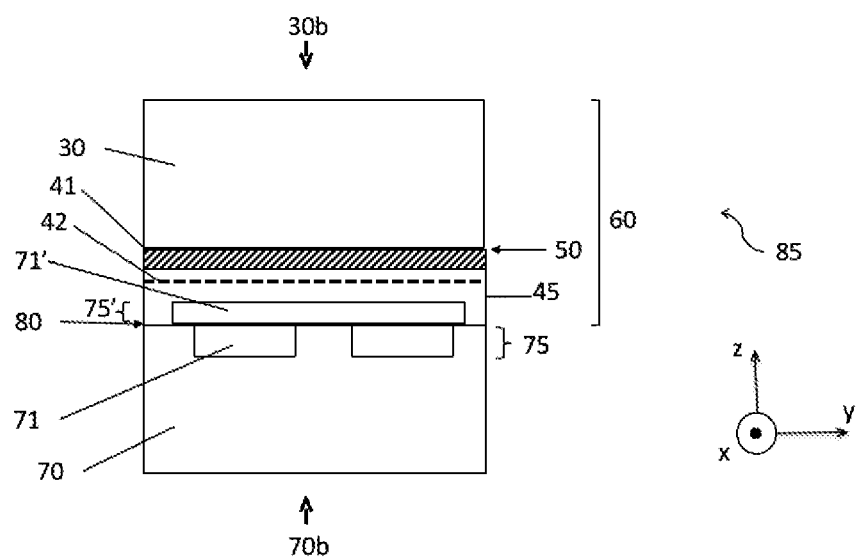

According to the second option mentioned above, for which the surface film 60', 60" of the stacked structure 100 targeted by the present process comprises a functional layer 75' (second functional layer 75'), the production process comprises a step d') of forming the second functionalized layer 75' on the front face 60a of the donor substrate 60. Conventional microelectronics and/or micro- or nanomachining techniques could be implemented to produce micro- or nanostructured regions and/or the cavities 71' (FIGS. 4A, 5A). Given the presence of the buried weakened plane 32, 42, the sequences of producing the second functional layer 75' should involve only low temperatures, typically lower than 250° C.

As illustrated in FIG. 4A (in accordance with the first embodiment) and 5A (in accordance with the second embodiment), the donor substrate 60 may, for example, undergo local etching, so as to define one or more cavities 71' on the side of the front face 60a, in the donor layer 45.

Figure 2E:
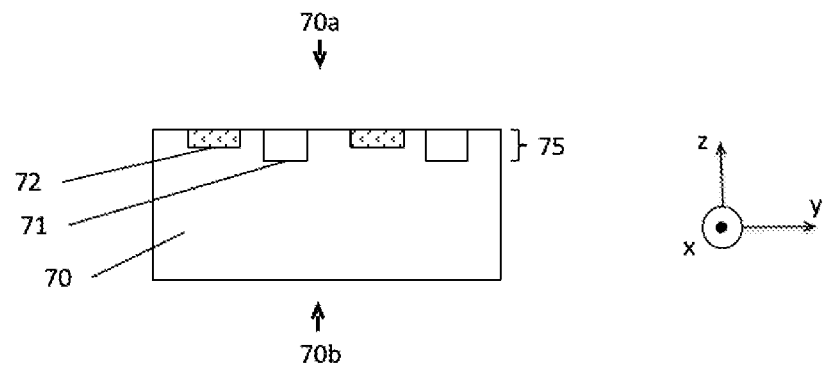
Figure 2F:
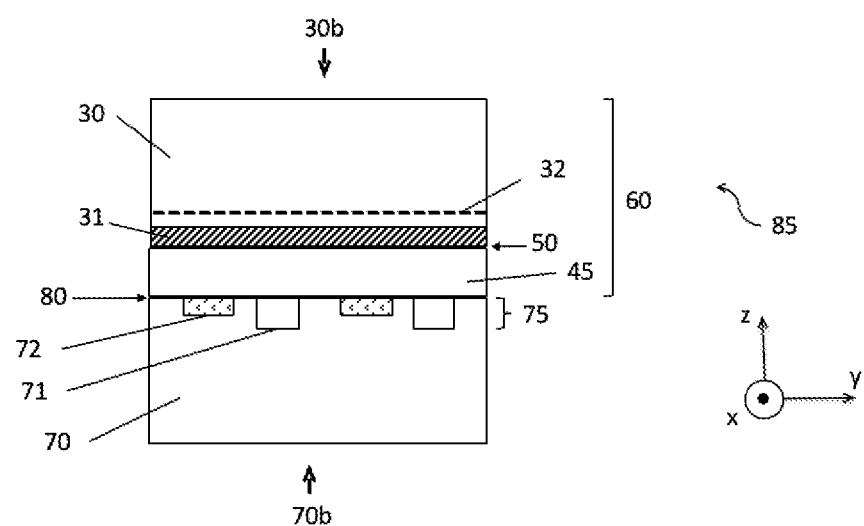
Figure 3E:
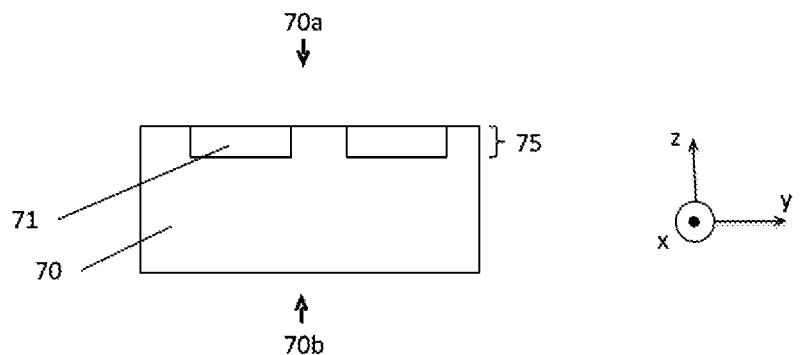
Figure 3F:
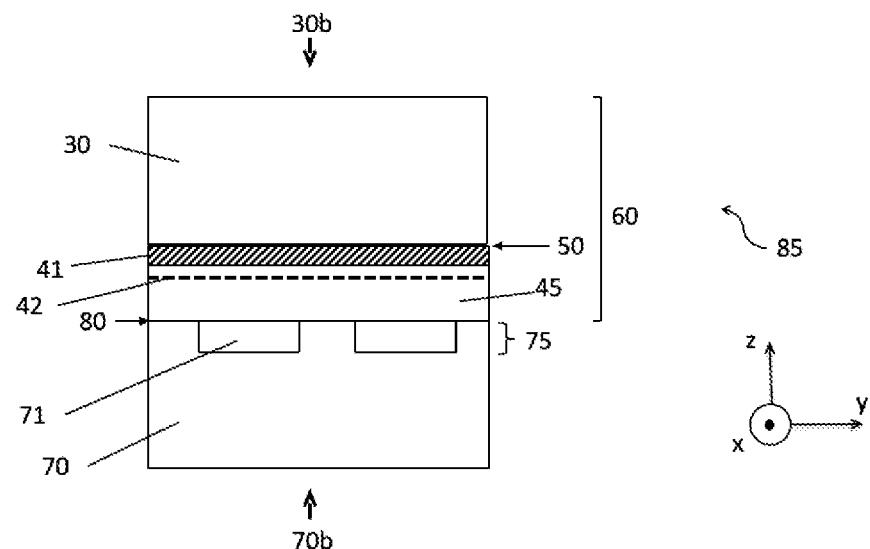

The production process next comprises a step e) of providing a receiver substrate 70 having a front face 70a and a back face 70b (FIGS. 2E and 3E). As mentioned above, the receiver substrate 70 is advantageously in the form of a wafer, with a diameter greater than 100 mm, for example, 150 mm, 200 mm, 300 mm, or even 450 mm, its thickness is typically between a few tens of microns and 1000 microns; it may be formed from any semiconductor, insulating or conductive material, depending on the target application. Because it is a material that is available, compatible with all microelectronics processes and has advantageous mechanical and electrical properties, silicon preferably forms the receiver substrate 70 when this substrate is provided with a functionalized layer 75 as defined above according to the second aspect of the present disclosure.

The receiver substrate 70 may also be fragile or very thin in nature as mentioned in the first aspect of the present disclosure.

According to the second aspect of the present disclosure mentioned above, the method therefore comprises a step e') of forming a functionalized layer 75 on the front face 70a of the receiver substrate 70. Conventional microelectronics and/or micro- or nanomachining techniques could be implemented to produce the micro- or nanostructured regions, the cavities 71, and/or the partially or completely formed micro- or nanoelectronic components of the functional layer 75. These elements may correspond to passive components (resistors, capacitors, etc.) or active components such as transistors; they may even correspond to MEMSs, sensors or actuators. They are advantageously based on silicon technology, but may also be based on other semiconductor or piezoelectric technology streams, for example.

A cavity 71 could have lateral dimensions, in the (x, y) plane of the front face 70a, typically between 1 micron and a few hundreds of microns, for example, 200 to 500 microns, and a height (or depth), along the z-axis normal to the front face 70a, typically on the order of 0.1 micron to a few tens of microns.

The one or more cavities 71 may be empty, i.e., devoid of solid material, or filled with a sacrificial solid material, which will be removed later, in the process for producing the stacked structure 100 or during the production of devices on the basis of the stacked structure 100. Alternatively, the cavity 71 may be filled with a useful material, which will subsequently be retained because it provides a functionality (such as, for example, insulation).

It should be noted that it may be more advantageous to have, at this stage, filled cavities 71 in order to facilitate the later steps of the production process. The material arranged in the cavities 71 may be silicon oxide, silicon nitride, amorphous or polycrystalline silicon, etc. When the material is sacrificial, it is chosen depending on the nature of the receiver substrate 70 and potentially of the surface film 60', 60". Specifically, since it is intended to be removed after the stacked structure 100 has been formed, it should be able to be chemically etched with good selectivity with respect to the receiver substrate 70 and the surface film 60', 60", arranged above the cavities 71.

The production process according to the present disclosure next comprises a step f) of joining the donor substrate 60 and the receiver substrate 70 via their respective front faces 60a, 70a (FIGS. 2F, 3F, 4B, 5B).

Like for the preceding joining step c), various types of joining are conceivable, such as, for example, direct bonding at ambient temperature, by molecular adhesion, or thermo-compression or eutectic bonding at low temperature, with joining surfaces of insulating or metal nature. The joining may be carried out under ambient atmosphere, in vacuum or under a particular controlled atmosphere. A joining interface 80 is thus defined between the two substrates 60, 70, which form, at this stage of the process, a second bonded structure 85.

Although not shown in the figures, it is entirely conceivable to form an intermediate layer on the front face 60a, 70a of either or both of the substrates 60, 70 to be joined prior to step f). An electrically conductive or insulating intermediate layer, depending on the needs of the application, and for improving the quality and mechanical strength of the bonding interface 80, will be favored. By way of example, an intermediate layer made of silicon oxide, of silicon nitride, of polysilicon or a metal layer such as copper may be used.

Advantageously, sequences of cleaning, of plasma surface activation and/or of smoothing treatments (such as, for example, chemical-mechanical polishing) are applied to the substrates 60, 70 before their joining, still with a view to guaranteeing good bonding quality.

Optionally, a heat treatment for consolidating the interface 80 is carried out, by subjecting the second bonded structure 85 to a low temperature, typically lower than 300° C. The thermal budget applied to the second bonded structure 85 during this heat treatment remains here below the thermal budget allowing spontaneous separation at the level of the buried weakened plane 32, 42.

Lastly, the production process according to the present disclosure comprises a step g) of separation, along the buried weakened plane 32, 42, so as to form the stacked structure 100 including the receiver substrate 70, the surface film 60', 60" comprising all or part of the donor layer 45, and when either or both is or are present, the first 75 and the second 75' functionalized layers (FIGS. 2G, 3G, 1A to 1C).

The separation along the buried weakened plane 32, 42 is achieved by means of a heat treatment, which will cause splitting in the region of microcracks under gas pressure generated by the implanted species.

In the case of a buried weakened plane 32, 42 formed in silicon, the heat treatment is carried out at a temperature typically between 200° C. and 600° C., for a few minutes to a few hours, so as to cause spontaneous propagation of the split along the weakened plane 32, 42.

Of course, in the case where the first 75 and/or the second 75' functionalized layer includes materials that are sensitive to medium and high temperatures, the temperature of the separation heat treatment will be chosen so as to be as low as possible, for example, between 200° C. and 325° C.

Potentially, the thermal budget may be supplemented with the application of a mechanical stress of reasonable intensity. In this case, to prevent the separation taking place at interfaces or in layers other than the buried weakened plane 32, 42, care will be taken to apply a high weakening thermal budget to the weakened plane 32, 42, so as to require only a small mechanical stress, just enough to initiate the spontaneous propagation of the split.

Figure 2G:
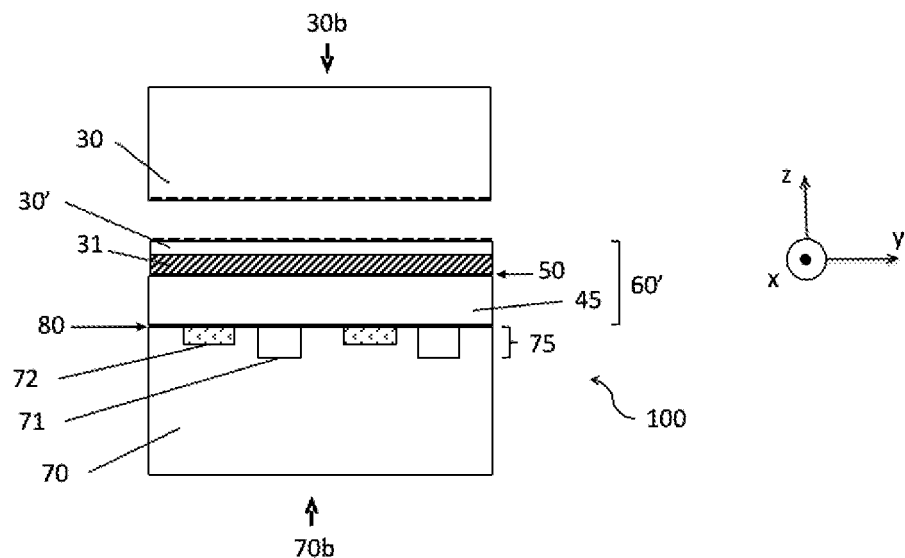

According to the embodiment illustrated in FIG. 2G, the surface film 60" comprises the thick donor layer 45, an intermediate layer 31 (protective layer or bonding layer) if present, and a thin layer 30" transferred from the carrier substrate 30. Specifically, since the buried weakened plane 32 is located in the carrier substrate 30, the separation gives rise to a transferred layer 30" attached to the stacked structure 100 on the one hand, and to a remainder of the carrier substrate 30. The transferred layer 30" and potentially the intermediate layer 31 may readily be removed by dry or wet chemical etching. Given their low thicknesses, such chemical etching is very well controlled and fast, and it does not constitute an aggressive step liable to degrade the stacked structure 100. Upon completion of this etching, what is obtained is a stacked structure 100 comprising a surface film 60" consisting of the thick donor layer 45, typically between a few microns and 100 microns, or preferably between 5 microns and 50 microns, of very good quality: specifically, the integrity and uniformity of thickness of the donor layer 45 are ensured in step d) of thinning the first bonded structure 55; this step is very well controlled because it is performed on virgin substrates potentially with simple stacks of uniform and continuous layers. Separation step g) applied to the second bonded structure 85, potentially comprising the one or more functionalized layers 75, 75", is much less restrictive than the lengthy and aggressive mechanical and chemical thinning steps (removal of several tens of microns of material) or the mechanical separation steps that are proposed in the prior art for transferring a thick surface film 60" onto a receiver substrate 70.

Figure 3G:
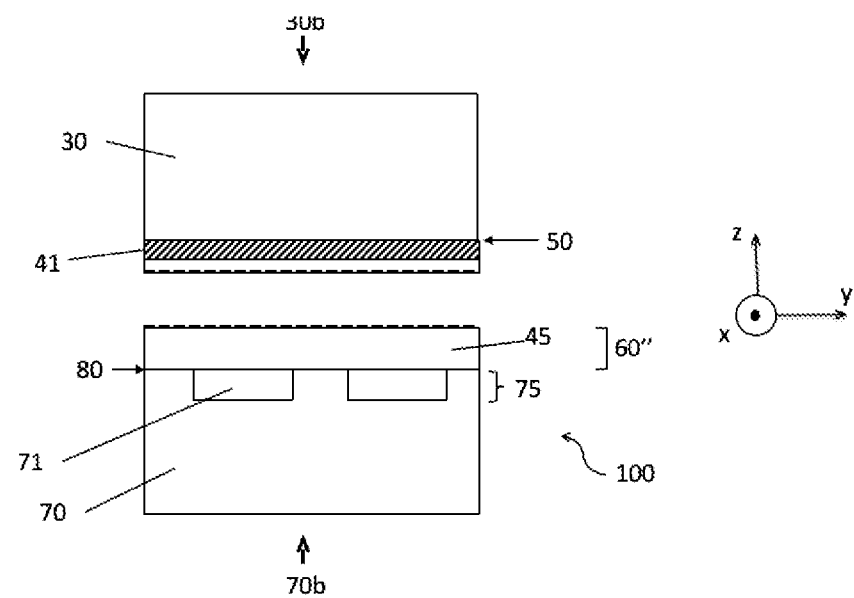

In the second embodiment illustrated in FIG. 3G, the surface film 60"" consists of a transferred portion of the donor layer 45. Specifically, since the buried weakened plane 42 is located in the initial substrate 40, and more particularly in the donor layer 45, the separation gives rise to a transferred portion 60" attached to the stacked structure 100 on the one hand, and to a remainder of the donor substrate 60.

Steps of chemical-mechanical polishing, cleaning and/or chemical etching, removing a few hundreds of nanometers from the surface film 60" on the side of the front face 100*a* of the stacked structure 100, readily allow, if necessary in the light of the application, the restoration of a good surface state (a low roughness, low defect density) to the surface film 60". It is not necessary to remove much material because the defect-containing region remaining after separation of the buried weakened plane 42 is of low thickness, as known with reference to the SMARTCUT® process. In this second embodiment, likewise obtained is a stacked structure 100 comprising a thick surface film 60", typically between a few microns and 100 microns, or preferably between 5 microns and 50 microns, of very high quality because the integrity and uniformity of thickness of the donor layer 45 are ensured in step d) of thinning the first bonded structure 55.

The production process according to the present disclosure thus makes it possible to transfer a thick surface film 60", 60" ", of high crystal quality (when the donor layer 45 is monocrystalline), exhibiting perfect integrity and excellent uniformity of thickness, even when it is transferred onto a functionalized layer 75 comprising components 72, cavities 71 and/or other structured layers.

When the first functional layer 75 comprises cavities 71, it is possible to produce devices, based on membranes, portions of the surface film 60", 60", which are movable above the cavities 71, on the basis of the stacked structure 100 obtained. It is necessary to selectively etch the sacrificial material filling the cavities 71, if the cavities 71 are indeed filled at this stage of the process.

It should be noted that the remainder of the carrier substrate 30 or the remainder of the donor substrate 60 may be treated with a view to reuse for a new production cycle.

According to a first example, the substrates implemented are wafers with a diameter of 300 mm.

The initial substrate 40 is a bulk substrate made of monocrystalline silicon comprising a thermal silicon oxide layer $SiO_2$ of 0.3 micron, at least on its front face 40*a*.

The carrier substrate 30 is a bulk substrate made of lower-grade (low-cost) monocrystalline silicon comprising a thermal silicon oxide layer $SiO_2$ of 0.3 micron, at least on its front face 30*a*. The initial and the carrier substrates 40, 30 have standard thicknesses (on the order of 700-800 microns).

The initial substrate 40 is implanted, at the level of its front face 40*a*, with H+ hydrogen ions at a conventional dose on the order of $6^E16/cm^2$ and an energy of between 60 and 120 keV, so as to form the buried weakened plane 42.

The joining of the front faces 40a, 30a of the initial substrate 40 and of the carrier substrate 30 implements SiO$_2$/SiO$_2$ direct bonding at ambient temperature. A consolidating anneal at a low temperature of between 200° C. and 250° C., for 1 h to 2 h, is then applied to the bonded structure 55.

The bonded structure 55 is then thinned, at the level of the back face 40b of the initial substrate 40, by means of mechanical grinding and mechanical trimming. These mechanical grinding steps are followed by chemical-mechanical polishing and conventional cleaning sequences (such as SC1, SC2, etc.), so as to form the donor substrate 60. The donor layer 45 has a thickness of 15 microns, and a surface quality (defect density, roughness) that is compatible with later joining (typically, a roughness of less than 0.5 nm RMS) to the receiver substrate 70.

The receiver substrate 70 is a bulk substrate made of monocrystalline silicon, with a thickness of less than 400 microns, polished on the back face and comprising a thermal silicon oxide layer SiO$_2$ of 0.3 micron, at least on its front face 70a.

A functionalized layer 75 is formed on the receiver substrate 70, for example, by means of lithography and local etching: it comprises a plurality of cavities 71, which are isolated from one another, with a depth of 5 microns and lateral dimensions of 350 microns. The cavities 71 could be round, square or take another polygonal shape, in the plane of the front face 70a.

The joining of the donor substrate 60 and of the receiver substrate 70 is performed by direct bonding at ambient temperature, under ambient atmosphere or in vacuum.

A heat treatment at 400° C. is then applied so as to cause separation along the buried weakened plane 42, giving rise on the one hand to the stacked structure 100 with its surface film 60" and on the other hand to the remainder of the donor substrate 60.

To restore the surface roughness and quality of the surface film 60", a heat treatment comprising sacrificial oxidation or smoothing may be applied. Optionally, chemical-mechanical polishing with a low degree of removal (typically less than 0.5 micron) and/or chemical etching may be applied.

Such a stacked structure 100 may, for example, be used to produce a pressure sensor.

In a second example, the substrates implemented are wafers with a diameter of 200 mm or 300 mm.

The carrier substrate 30 is a bulk substrate made of lower-grade (low-cost) monocrystalline silicon.

The carrier substrate 30 is a bulk substrate made of lower-grade monocrystalline silicon comprising a thermal silicon oxide layer SiO$_2$ of 0.4 micron, at least on its front face 30a. The initial and the carrier substrates 40, 30 have standard thicknesses (on the order of 700-800 microns).

The carrier substrate 30 is implanted, at the level of its front face 30a, with H+ hydrogen ions at a conventional dose on the order of 6$^E$16/cm$^2$ and an energy of between 60 and 120 keV, so as to form the buried weakened plane 32.

The joining of the front faces 40a, 30a of the initial substrate 40 and of the carrier substrate 30 implements Si/SiO$_2$ direct bonding at ambient temperature. A consolidating anneal at a low temperature of between 200° C. and 250° C., for 1 h to 2 h, is then applied to the bonded structure 55.

The bonded structure 55 is then thinned, at the level of the back face 40b of the initial substrate 40, by means of mechanical grinding including mechanical trimming, followed by chemical-mechanical polishing and conventional cleaning sequences (such as SC1, SC2, etc.), so as to form the donor substrate 60. The donor layer 45 has a thickness of 30 microns, and a surface quality (defect density, roughness) that is compatible with later joining (typically, a roughness of less than 0.5 nm RMS) to the receiver substrate 70.

The receiver substrate 70 is formed of monocrystalline silicon and comprises MEMS components such as accelerometers or gyroscopes, which form the first functionalized layer 75.

A second functionalized layer 75' is formed on the donor layer 45, for example, by means of lithography and local etching: it comprises a plurality of cavities 71', with a depth of 3 microns and lateral dimensions of 1.5 mm×1.5 mm.

The joining of the donor substrate 60 and of the receiver substrate 70 is performed by direct bonding at ambient temperature, in vacuum.

A heat treatment at between 350° C. and 450° C. may then be applied so as to cause separation along the buried weakened plane 32, giving rise on the one hand to the stacked structure 100 with its surface film 60' and on the other hand to the remainder of the carrier substrate 30.

To restore the surface roughness and quality of the surface film 60', a small degree of removal (typically, less than 0.5 micron) by means of chemical etching may be carried out.

Such a stacked structure 100 may, for example, be used to produce the wafer-level packaging of inertial sensors.

Of course, the present disclosure is not limited to the embodiments and to the examples described, and alternative embodiments may be introduced thereto without departing from the scope of the invention as defined by the claims.

The invention claimed is:

1. A method for producing a stacked structure comprising a receiver substrate and a surface film, the method comprising:
   a) providing a carrier substrate and an initial substrate, each having a front face and a back face;
   b) forming a buried weakened plane in the carrier substrate by implanting light ions through the front face of the carrier substrate;
   c) joining the carrier substrate and the initial substrate via their respective front faces;
   d) mechanically and/or chemically thinning the initial substrate via its back face to form a donor substrate comprising a donor layer originating from the initial substrate and arranged on the carrier substrate, and the buried weakened plane present in the carrier substrate, the donor substrate having a front face on the side of the donor layer and a back face on the side of the carrier substrate;
   e) providing a receiver substrate having a front face and a back face;
   f) joining the donor substrate and the receiver substrate via their respective front faces; and
   g) separating along the buried weakened plane, so as to form the stacked structure comprising the receiver substrate and the surface film including the donor layer and a thin transferred layer that originates from the support substrate.

2. The method of claim 1, further comprising a step, prior to joining step f), of forming at least one functionalized layer on the front face of the donor substrate and/or on the front face of the receiver substrate, the stacked structure comprising the receiver substrate, the surface film and the functionalized layer inserted between the receiver substrate and the surface film.

3. The method of claim 2, wherein the functionalized layer comprises a plurality of micro- or nanostructured regions and/or a plurality of cavities and/or a plurality of micro- or nanoelectronic components.

4. The method of claim 3, wherein the functionalized layer comprises at least one component chosen from among the group consisting of transistors, MEMSs, sensors, resonators, imagers, actuators, radiofrequency filters, diodes and lasers.

5. The method of claim 3, wherein the functionalized layer comprises cavities having lateral dimensions of between 1 micron and a few hundreds of microns, and a depth of 0.1 micron to a few tens of microns.

6. The method of claim 1, further comprising removing the transferred thin layer by chemical etching.

7. The method of claim 1, wherein the surface film is formed from at least one semiconductor material chosen from among the group consisting of silicon, germanium, silicon carbide, and III-V compounds, and/or from at least one insulating material chosen from among the group consisting of sapphire and diamond, and/or from at least one piezoelectric material chosen from among the group consisting of lithium tantalate and lithium niobate.

8. The method of claim 1, wherein the receiver substrate is formed from at least one semiconductor and/or insulating and/or metal, monocrystalline, polycrystalline or amorphous material.

9. The method of claim 1, wherein the receiver substrate has a thickness of between a few tens of microns and 1000 microns.

\* \* \* \* \*